United States Patent
Ulavi et al.

(10) Patent No.: US 11,107,704 B2
(45) Date of Patent: Aug. 31, 2021

(54) GAS INPUT SYSTEM FOR A SUBSTRATE PROCESSING CHAMBER

(71) Applicant: Applied Materials, Inc., Santa Clara, CA (US)

(72) Inventors: Tejas Ulavi, San Jose, CA (US); Thuy Britcher, San Jose, CA (US); Amit Kumar Bansal, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 176 days.

(21) Appl. No.: 16/519,586

(22) Filed: Jul. 23, 2019

(65) Prior Publication Data

US 2020/0075353 A1 Mar. 5, 2020

Related U.S. Application Data

(60) Provisional application No. 62/727,291, filed on Sep. 5, 2018.

(51) Int. Cl.
| | |
|---|---|
| *H01L 21/02* | (2006.01) |
| *H01L 21/67* | (2006.01) |
| *G05D 7/06* | (2006.01) |

(52) U.S. Cl.
CPC ..... *H01L 21/67017* (2013.01); *G05D 7/0652* (2013.01); *H01L 21/02164* (2013.01); *H01L 21/02271* (2013.01)

(58) Field of Classification Search
CPC ........ H01L 21/67017; H01L 21/02164; G05D 7/0652
See application file for complete search history.

(56) References Cited

U.S. PATENT DOCUMENTS

| | | | |
|---|---|---|---|
| 3,418,805 A | 12/1968 | Barish et al. | |
| 8,573,209 B2 | 11/2013 | Bathe et al. | |
| 2005/0224116 A1 | 10/2005 | Olander et al. | |
| 2007/0082507 A1* | 4/2007 | Iyer | C23C 16/45565 438/795 |
| 2008/0251137 A1* | 10/2008 | Ngo | C23C 16/52 137/486 |

(Continued)

FOREIGN PATENT DOCUMENTS

| | | |
|---|---|---|
| JP | 2015137387 A | 7/2015 |
| KR | 100497276 B1 | 7/2005 |

OTHER PUBLICATIONS

International Search Report and Written Opinion issued in corresponding International Patent Application No. PCT/US2019/043092, dated Nov. 13, 2019 (11 pages).

*Primary Examiner* — Mohammad M Choudhry
(74) *Attorney, Agent, or Firm* — Patterson + Sheridan, LLP

(57) ABSTRACT

A substrate processing system includes a processing chamber that includes a substrate support positioned therein. The substrate processing system includes a valve system fluidly coupled to the processing chamber and configured to control flow of gas into the processing chamber. The valve system includes a primary flow line and a first gas source flow line fluidly coupled to the primary flow line through a first gas source valve. The valve system includes a second gas source flow line fluidly coupled to the primary flow line through a second gas source valve. The first gas source valve and the second gas source valve are positioned in series within the primary flow line.

19 Claims, 7 Drawing Sheets

(56) References Cited

U.S. PATENT DOCUMENTS

| | | |
|---|---|---|
| 2011/0071316 A1 | 3/2011 | Millward et al. |
| 2012/0097266 A1* | 4/2012 | Cobb ............... F16K 51/02 |
| | | 137/343 |
| 2012/0227817 A1* | 9/2012 | Cruse ............... B01F 3/028 |
| | | 137/1 |
| 2013/0019960 A1 | 1/2013 | Choi et al. |
| 2016/0017493 A1 | 1/2016 | Dhas et al. |

* cited by examiner

GAS INPUT SYSTEM FOR A SUBSTRATE PROCESSING CHAMBER

CROSS-REFERENCE TO RELATED APPLICATIONS

This application claims benefit of U.S. provisional patent application Ser. No. 62/727,291, filed Sep. 5, 2018, which is herein incorporated by reference.

BACKGROUND

Field

Aspects of the present disclosure generally relate to methods of and apparatuses for introducing gas into a substrate processing chamber.

Description of the Related Art

In the current semiconductor manufacturing industry, gases are used for processing substrates in a processing chamber. These gases may be cycled between each other when processing the substrates within the processing chamber. Further, certain gases used for processing the substrates may not be compatible with each other, in that the gases should not be mixed within the processing chamber, or even within the conduits or paths leading to the processing chamber. The mixing of the gases may lead to particle formation or dusting, which may accumulate on the substrates being processed. The particle formation may lead to non-uniform substrates and contamination of the substrates, thereby decreasing quality and yield of the substrates. To avoid mixing of non-compatible gases, the gases are purged, such as out of the processing chamber and the conduits and gas delivery paths, using a carrier or purge gas. The gas may be purged between different layers of film deposition on the substrate. However, the purging may decrease the efficiency or throughput of the processing of the substrates, and furthermore may still leave residual gases that may contaminate the substrates being processed.

Accordingly, there is a need for a gas input or delivery system that decreases the amount of residual gas remaining within the system and the processing chamber and that may decrease purge time.

SUMMARY

Aspects of the present disclosure generally relate to methods of and apparatuses for introducing gas into a substrate processing chamber. In one implementation, a substrate processing system includes a processing chamber that includes a substrate support positioned therein. The substrate processing system includes a valve system fluidly coupled to the processing chamber and configured to control flow of gas into the processing chamber. The valve system includes a primary flow line and a first gas source flow line fluidly coupled to the primary flow line through a first gas source valve. The valve system includes a second gas source flow line fluidly coupled to the primary flow line through a second gas source valve. The first gas source valve and the second gas source valve are positioned in series within the primary flow line.

In one implementation, a substrate processing system includes a processing chamber that includes a substrate support positioned therein. The substrate processing system includes a valve system fluidly coupled to the processing chamber and configured to control flow of gas into the processing chamber. The valve system includes a primary flow line, an oxygen ($O_2$) flow line fluidly coupled to the primary flow line through an oxygen source valve. The valve system includes a tetraethyl orthosilicate (TEOS) (Si($OC_2H_5$)$_4$) flow line fluidly coupled to the primary flow line through a TEOS source valve. The valve system includes a silane ($SiH_4$) flow line fluidly coupled to the primary flow line through a silane source valve, and a carrier gas flow line fluidly coupled to the primary flow line through a carrier gas source valve. The oxygen source valve, the TEOS source valve, the silane source valve, and the carrier gas source valve are positioned in series within the primary flow line. The carrier gas source valve is positioned upstream within the primary gas source line with respect to the oxygen source valve, the TEOS source valve, and the silane source valve.

In one implementation, a method of distributing gas into a processing chamber includes positioning a substrate upon a substrate support within a processing chamber. The method includes providing a first gas to the processing chamber through a first gas source valve that fluidly couples a first gas source flow line to a primary flow line. The method includes providing a second gas to the processing chamber through a second gas source valve that fluidly couples a second gas source flow line to the primary flow line. The first gas source valve and the second gas source valve are positioned in series within the primary flow line.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of scope, as the disclosure may admit to other equally effective aspects.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

The present disclosure generally relates to apparatuses and methods for depositing gas into a processing chamber, such as for depositing or forming film on a substrate. Certain details are set forth in the following description and in FIGS. 1-8 to provide a thorough understanding of various implementations of the disclosure. Other details describing well-known structures and systems often associated with deposition and etching processes are not set forth in the following disclosure to avoid unnecessarily obscuring the description of the various implementations. The apparatus generally relates to a valve system fluidly coupled to a processing chamber. The processing chamber includes a substrate support for supporting a substrate thereon during processing within the processing chamber. The valve system includes a primary flow line fluidly coupled to a first and second gas source flow line through first and second gas source valves. The first and second gas source valves are positioned in series within the primary flow line. Further, a diverting gas source flow line may be fluidly coupled to the first gas source line through a first gas diverter valve. Methods of using the same are also provided.

Figure 1:
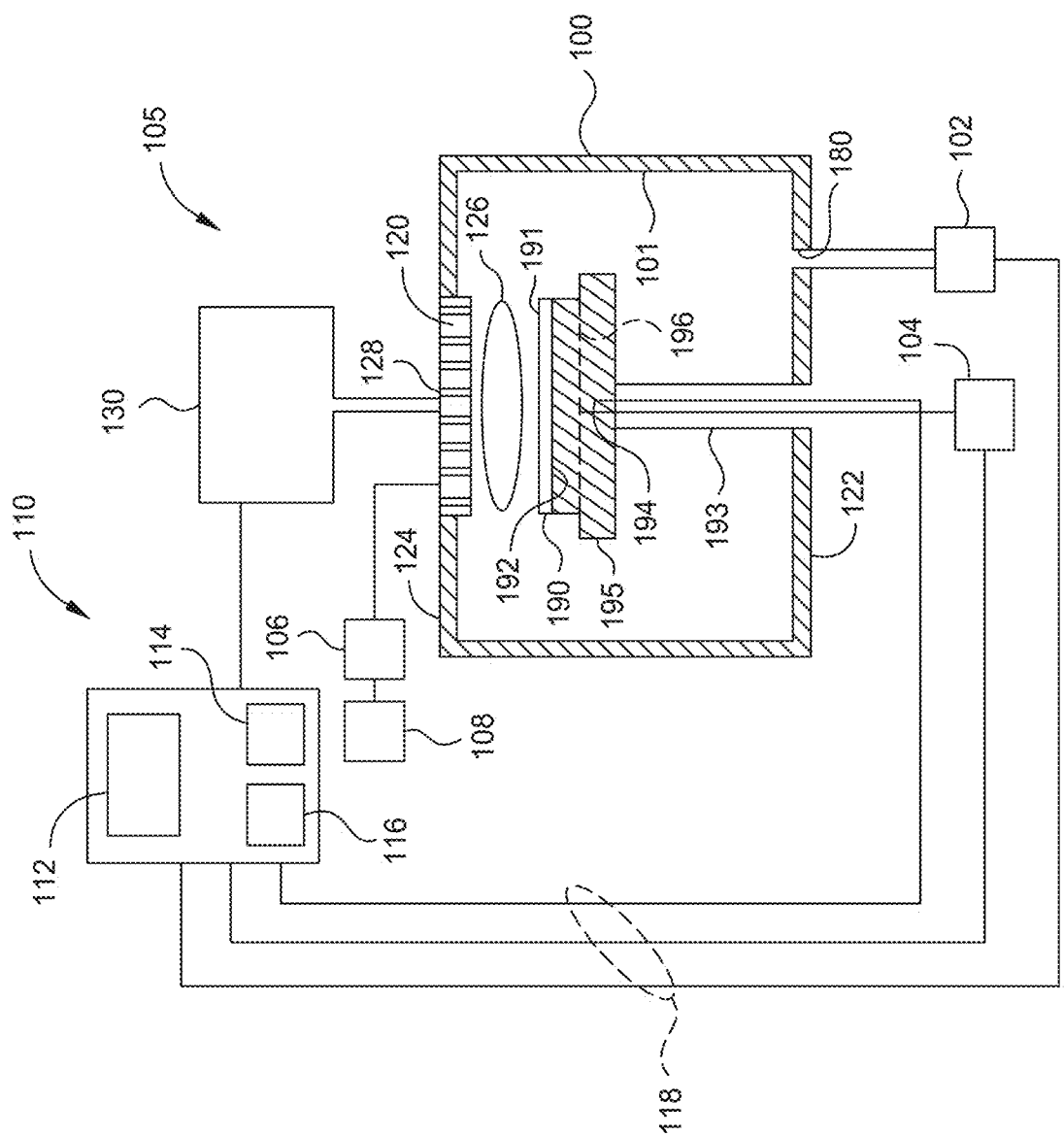
FIG. 1 is a schematic illustration of a substrate processing system, in accordance with one implementation of the present disclosure.

FIG. 1 depicts a schematic illustration of a substrate processing system 105 that may be used in accordance with one or more implementations of the present disclosure. The substrate processing system 105 includes a processing chamber 100 coupled to a valve system 130 and a controller 110. The processing chamber 100 generally includes a top wall 124, a sidewall 101, and a bottom wall 122 that define a processing volume 126. A substrate support 195 for supporting a substrate 190 is provided in the processing volume 126. The substrate support 195 is supported by a stem 193 and may be typically fabricated from aluminum, ceramic, and/or other suitable materials. The substrate support 195 may be moved in a vertical direction inside the processing chamber 100 using a displacement mechanism.

The substrate support 195 may include an embedded heating element 196 suitable for controlling the temperature of a substrate 190 supported on a surface 192 of the substrate support 195. The substrate support 195 may be resistively heated by applying an electric current from a power supply 104 to the embedded heating element 196. The electric current supplied from the power supply 104 is regulated by the controller 110 to control the heat generated by the embedded heating element 196, thereby maintaining the substrate 190 and the substrate support 195 at a substantially constant temperature during film deposition. The supplied electric current may be adjusted to selectively control the temperature of the substrate support 195 between about 100 degrees Celsius to about 700 degrees Celsius.

A temperature sensor 194, such as a thermocouple, may be embedded in the substrate support 195 to monitor temperature of the substrate support 195 in a conventional manner. The measured temperature is used by the controller 110 to control the power supplied to the embedded heating element 196 to maintain the substrate at a desired temperature.

An outlet port 180 is included with the processing chamber 100, such as formed in the bottom of the processing chamber 100 as shown in FIG. 1. A vacuum pump 102 may be coupled (such as fluidly coupled) to the outlet port 180, in which the vacuum pump 102 is used to maintain a desired gas pressure in the processing chamber 100. The vacuum pump 102 also evacuates residual or post-processing gases and by-products of the process from the processing chamber 100. The vacuum pump 102 is configured to pump fluids, such as gas, out of the processing chamber 100.

The substrate processing system 105 may further include additional equipment for controlling the chamber pressure, for example, valves (e.g., throttle valves and/or isolation valves) positioned between the processing chamber 100 and the vacuum pump 102 to control the chamber pressure.

An inlet port 120 is included with the processing chamber 100 to introduce gas into the processing chamber 100. As shown in FIG. 1, the inlet port 120 is shown as a showerhead, however, other inlets are also contemplated. The inlet port 120 has a plurality of apertures 128 and is disposed on the top of the processing chamber 100 above the substrate support 195. The inlet port 120 is utilized to introduce one or more gases from one or more gas sources into the processing chamber. The gases may include one or more reactant gases, such as oxygen, silane, and/or tetraethyl orthosilicate, and one or more carrier gases, such as argon, nitrogen and/or helium. In one example, the one or more carrier gases include one or more inert gases. The apertures 128 may vary and differ in sizes, number, distribution, shape, design, and/or diameter to facilitate the flow of the various gases for different process requirements. The inlet port 120 is connected to the valve system 130 that allows various gases to be supplied to the processing volume 126 during processing. A plasma is formed from the gas or mixture of gases exiting the inlet port 120 and flowing into the processing volume 126. The plasma may enhance thermal decomposition of the process gases resulting in the deposition of material on a surface 191 of the substrate 190.

The inlet port 120 and substrate support 195 may form or include a pair of spaced apart electrodes in the processing volume 126. One or more RF power sources 108 provide a bias potential through a matching network 106 to the inlet port 120 to facilitate generation of plasma between the inlet port 120 and the substrate support 195. The one or more RF power sources 108 and matching network 106 may be coupled to the inlet port 120, the substrate support 195, or coupled to both the inlet port 120 and the substrate support 195, or coupled to an antenna disposed exterior to the processing chamber 100. In one example, the RF power sources 108 may provide between about 100 Watts and about 3,000 Watts at a frequency of about 50 kHz to about 13.6 MHz. In one example, the RF power sources 108 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the valve system 130. The CPU 112 may be of any form of a general-purpose computer processor that may be used in an industrial setting. The software routines may be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bidirectional communications between the controller 110 and the various components of the substrate processing system 105 are handled through numerous signal cables collectively referred to as signal buses 118, some of which are illustrated in FIG. 1.

In one example, the surface 191 of the substrate 190 is substantially planar. Alternatively, the substrate 190 may have patterned structures, such as a surface having trenches, holes, and/or vias formed therein. The substrate 190 may also have a substantially planar surface having a structure formed thereon or therein at a desired elevation. While the substrate 190 is illustrated as a single body, it is understood that the substrate 190 may contain one or more materials used in forming semiconductor devices such as metal contacts, trench isolations, gates, bitlines, or any other interconnect features. The substrate 190 may be formed by one or more metal layers, one or more dielectric materials, semiconductor material, and combinations thereof utilized to fabricate semiconductor devices. For example, the substrate 190 may include an oxide material, a nitride material, a polysilicon material, or the like, depending upon the application.

In an example for a memory application, the substrate 190 may include the silicon substrate material, an oxide material, and a nitride material, with or without polysilicon sandwiched in between. In one example, the substrate 190 may include a plurality of alternating oxide and nitride materials (e.g., oxide-nitride-oxide (ONO)) deposited on a surface of the substrate. In various implementations, the substrate 190 may include a plurality of alternating oxide and nitride materials, one or more oxide or nitride materials, polysilicon or amorphous silicon materials, oxides alternating with amorphous carbon, oxides alternating with polysilicon, undoped silicon alternating with doped silicon, undoped polysilicon alternating with doped polysilicon, and/or undoped amorphous silicon alternating with doped amorphous silicon. The substrate 190 may be any substrate or material surface upon which film processing is performed. For example, the substrate 190 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and/or combinations thereof.

Figure 2:
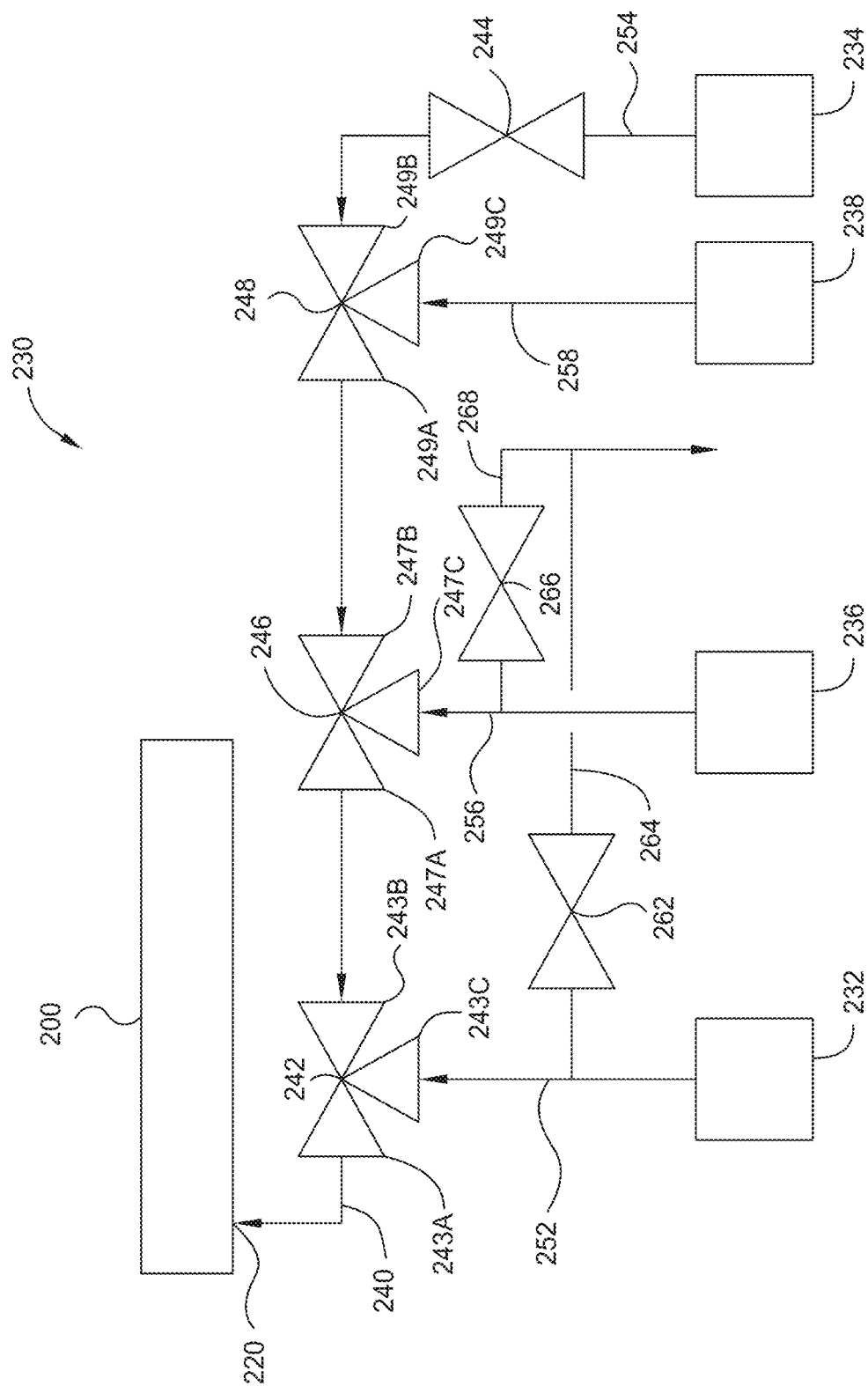
FIG. 2 is a schematic view of a valve system, in accordance with one implementation of the present disclosure.

FIG. 2 is a schematic view of a valve system 230 in accordance with one implementation of the present disclosure. The valve system 230 (which may be similar to, or used as, the valve system 130 of FIG. 1) includes a primary flow line 240 that is coupled to a processing chamber 200 (which may be similar to the processing chamber 100 of FIG. 1). The primary flow line 240 is used to selectively provide gas from one or more gas sources to the processing chamber 200, such as through an inlet port 220.

FIG. 2 shows gas sources 232, 234, 236, and 238 that may be provided through the primary flow line 240 to the processing chamber 200. In particular, gas sources 232, 236, and 238 may be reactant gas sources, and gas source 234 may be a carrier gas source. Thus, the valve system 230 is shown as providing one or more reactant gas sources 232, 236, or 238, and/or one or more carrier gas sources 234, to the processing chamber 200. In one example, the valve system 230 may be used to provide only two gas sources, such as a first reactant gas source 232 and a carrier gas source 234, to the processing chamber 200. The valve system 230 may be used to provide more gas sources to the processing chamber 200 than those shown in FIG. 2. Thus, the present disclosure contemplates other implementations than those shown in FIG. 2.

Accordingly, the valve system 230 includes multiple gas source flow lines 252, 254, 256, 258 that are fluidly coupled to the primary flow line 240 to provide the gas sources 232, 234, 236, 238 to the primary flow line 240. Gas then provided to the primary flow line 240 may be introduced into the processing chamber 200, such as through an inlet port 220 of the processing chamber 200. The valve system 230 includes a first gas source flow line 252 that is fluidly coupled to primary flow line 240 through a first gas source valve 242. The first gas source flow line 252 is fluidly coupled to the first gas source 232 such that gas from the first gas source 232 is provided to the primary flow line 240 through the first gas source flow line 252. Gas from the first gas source flow line 252 is provided through the first gas source valve 242 to the primary flow line 240 such that the first gas source valve 242 controls gas flow between the first gas source flow line 252 and the primary flow line 240. In the event that the first gas source 232 is a reactant gas, the first gas source flow line 252 may be referred to as a first reactant gas source flow line and the first gas source valve 242 may be referred to as a first reactant gas source valve.

Similarly, the valve system 230 includes a second gas source flow line 254 that is fluidly coupled to primary flow line 240 through a second gas source valve 244. The second gas source flow line 254 is fluidly coupled to a second gas source 234 such that gas from the second gas source 234 is provided to the primary flow line 240 through the second gas source flow line 254. Gas from the second gas source flow line 254 is provided through the second gas source valve 244 to the primary flow line 240 such that the first gas source valve 242 controls gas flow between the first gas source flow line 252 and the primary flow line 240. In the event that the second gas source 234 is a carrier gas, the second gas source flow line 254 may be referred to as a carrier gas source flow line and the second gas source valve 244 may be referred to as a carrier gas source valve.

In the event that the first gas source 232 is a reactant gas and the second gas source 234 is a carrier gas, the carrier gas may be used to mix with the reactant gases to facilitate providing the reactant gases through the primary flow line 240 and to the processing chamber 200. For example, as the second gas source 234 and the second gas source flow line 254 including the carrier gas is the furthest upstream of the other gas sources and the gas source flow lines, the carrier gas may be used to facilitate transporting the other gas sources when flowing and being pumped downstream to the processing chamber 200. This upstream placement of the carrier gas from the second gas source 234 enables the carrier gas to pass by the first gas source valve 242 (and other gas source valves if included) en route to the processing chamber 200, thus serving the function of a carrier gas to carry reactant gas provided through the first gas source valve 242.

Additionally, the carrier gas may be used as a purge gas to purge the primary flow line 240 from any residual gases. For example, in between cycles when different concentrations or types of gases are provided through the primary flow line 240 to the processing chamber 200, the carrier gas may be provided through the second gas source flow line 254 to purge the primary flow line 240 of residual gas. This may particularly be used in between different layers of film deposition within the processing chamber 200. As shown, the second gas source valve 244 and the second gas source flow line 254 are positioned upstream within the primary flow line 240 with respect to the first gas source valve 242 and the first gas source flow line 252. This positioning facilitates having the carrier gas from the second gas source 234 to purge a length of the primary flow line 240, such as to purge the full length of the primary flow line 240.

The first gas source flow line 252 and the second gas source flow line 254 are fluidly coupled to the primary flow line 240 through the first gas source valve 242 and the second gas source valve 244. Further, the first gas source valve 242 and the second gas source valve 244 are positioned within the primary flow line 240, and positioned in series along the primary flow line 240. Having the valves positioned in series may decrease the residual gas buildup within the valve system 230. For example, when the valves are positioned in parallel, small spaces of volume, where residual gas may become trapped, are created between the valves and the primary flow line 240. When purging the valve system 230, such as between processing cycles, the purge gas may not be able to purge the residual gas within the small spaces of volume. Further, when the residual gas mixes with the other reactant gas sources, particulates may be formed within the primary flow line 240, which may lead to the processing of non-uniform substrates or substrate contamination. Thus, the positioning of first gas source valve 242 and second gas source valve 244 in series may be able to reduce or remove the dead volumes within the valve system 230 and decrease residual gas buildup within the valve system 230.

A carrier gas may be any number of carrier gases that are used in substrate processing without departing from the scope of the present disclosure. For example, a carrier gas may include, but is not limited to, one or more of argon (Ar), nitrogen ($N_2$), helium (He), and/or any combination thereof. A carrier gas may also be able to mix with the respective reactant gases without consequence. For example, introducing the carrier gas to the respective reactant gases will create a mixture without forming particulates or reacting in an unintended way such that the mixture interferes negatively with the substrate processing system 105.

The first gas source 232 may include a reactant gas source. The reactant gas may include any number of reactant gases used in substrate processing, including but not limited to one or more of oxygen ($O_2$), tetraethyl orthosilicate (TEOS) ($Si(OC_2H_5)_4$), and/or silane ($SiH_4$). In an example in which more than one reactant gas source is included with the valve system 230, additional gas source valves and gas source flow lines may be included within the valve system 230.

For example, as shown in FIG. 2, a third gas source flow line 256 and a fourth gas source flow line 258 are included within the valve system 230. The third gas source flow line 256 is fluidly coupled to primary flow line 240 through a third gas source valve 246, and the fourth gas source flow line 258 is fluidly coupled to primary flow line 240 through a fourth gas source valve 248. Gas from the third and fourth gas source flow lines 256, 258 is then provided through the third and fourth gas source valves 246, 248 to the primary flow line 240. As such, the third and fourth gas source valves 246, 248 are able to each respectively control gas flow between the third and fourth gas source flow lines 256, 258 and the primary flow line 240.

In an example in which multiple gas sources 232, 234, 236, and 238 and multiple gas source flow lines 252, 254, 256, and 258 are included within the valve system 230, the gas sources 232, 234, 236, and 238 may include different types of gas from each other. For example, the second gas source 234, as the most upstream gas source, may remain a carrier gas, while the gas sources 232, 236, and 238 may be reactant gas sources. In one example, the first gas source 232 may be oxygen, a third gas source 236 (or second reactant gas source) may be tetraethyl orthosilicate (TEOS), and a fourth gas source 238 (or third reactant gas source) may be silane. In such an example, the gas source valves 242, 246, and 248 can be referred to as an oxygen source valve 242, a TEOS source valve 246, and silane source valve 248, and the reactant gas source flow lines 252, 256, and 258 can be referred to as an oxygen flow line 252, a TEOS flow line 256, and a silane flow line 258. Thus, as shown in FIG. 2, the oxygen source valve 242, the TEOS source valve 246, the silane source valve 248, and the carrier gas source valve 244 are positioned in series along the primary flow line 240 to reduce the amount of unused volume within the valve system 230.

Referring still to FIG. 2, the first gas source valve 242 may be a three-way valve including three ports 243A, 243B, and 243C. Further, the first gas source valve 242 may be in a normally open position (e.g., a fail-safe open position) with respect to the primary flow line 240. For example, the ports 243A and 243B of the first gas source valve 242 are positioned along the primary flow line 240 and a third port 243C of the first gas source valve 242 is positioned along the first gas source flow line 252. The first gas source valve 242 is in the normally open position such that the ports 243A and 243B are open such to provide gas through the first gas source valve 242 along the primary flow line 240. Thus, even in circumstances when the valve 242 fails and the third port 243C is closed such that gas is not able to be provided from the first gas source flow line 252, gas is still able to flow within the primary flow line 240. The first gas source valve 242 may then be switched to a closed position to provide gas from the first gas source flow line 252 to the processing chamber 200. The closed position may prevent gas from flowing from the primary flow line 240 and through the second port 243B of the first gas source valve 242. The normally open position ensures that the default position of the valve, such as when the valve fails or is not actuated for use, is open.

The first gas source valve 242 is configured to move between a source open position and a source closed position. In the source open position, the gas from the first gas source 232 is configured to flow to the primary flow line 240. In the source closed position, the gas from the first gas source 232 is configured to flow to the first gas source diverter flow line 264. The first gas source diverter flow line 264 diverts the gas from the first gas source 232 such that the gas does not enter the processing chamber 200. In one example, first gas source diverter flow line 264 diverts the gas towards one or more of a scrubber, a flare, a storage tank, equipment that recycles or reuses the gas, and/or back towards the first gas source 232. The second gas source valve 244 is configured to move between a source open position and a source closed position. In the source open position, the gas from the second gas source 234 is configured to flow to the primary flow line 240. In the source closed position, the gas from the second gas source 234 is prevented from flowing to the primary flow line 240. In one example, the second gas source valve 244 is in the source open position when the first gas source valve 242 is in the source open position.

Further, as discussed above and shown in FIG. 2, when more than one reactant gas source flow lines 252, 256, and 258 are supplying gas to primary flow line 240, the second reactant gas source valve 246 and the third reactant gas source valve 248 are positioned similarly to the first reactant gas source valve 242 within the primary flow line 240. As such, the reactant gas source valves 246 and 248 may be three-way valves, in which the second reactant gas source valve 246 include ports 247A, 247B, 247C, and the third reactant gas source valve 248 includes ports 249A, 249B, 249C. The reactant gas source valve 246 may be in the normally open position such that ports 247A and 247B remain normally open during use to enable gas flow through the primary flow line 240. Similarly, the reactant gas source valve 248 may be in the normally open position such that ports 249A and 249B remain normally open during use to enable gas flow through the primary flow line 240.

Further, the second gas source valve 244 is a two-way valve to fluidly couple the second gas source 234 and the primary flow line 240. The second gas source valve 244 is in the normally open position such that the second gas source 234 may continuously flow into the primary flow line 240. As the second gas source valve 244 is generally controlling the flow of a carrier gas, the normally open position ensures that the carrier gas is flowing or pumped into the primary flow line 240 to transport or carry the reactant gases from the primary flow line 240 into the processing chamber 200. Thus, when the first gas source valve 242 is open, then the second gas source valve 244 will also be open.

In one example, one or more diverter valves 262 and 266 are used to selectively divert gas away from the primary flow line 240 within the valve system 230. For example, as shown in FIG. 2, a first gas source diverter flow line 264 that includes a first gas diverter valve 262 is fluidly coupled to the first reactant gas flow line 252, and a second gas source diverter flow line 268 that includes a second gas diverter valve 266 is fluidly coupled to the second reactant gas flow line 256. The first gas diverter valve 262 may be in a normally closed position with respect to the first gas source diverter flow line 264. The second gas diverter valve 266 may be in a normally closed position with respect to the second gas source diverter flow line 268.

The first gas diverter valve 262 may be opened (and the first reactant gas valve 242 may be closed) such that gas from the first reactant gas source 232 is diverted through the first gas diverter valve 262 and to the first gas source diverter flow line 264. This arrangement diverts the first reactant gas source 232 away from the primary flow line 240 within the valve system 230. Similarly, the second gas diverter valve 266 may be opened (and the second reactant gas source valve 246 may be closed) such that gas from the second reactant gas source 236 is diverted through the second gas diverter valve 266 and to the second gas source diverter flow line 268. This arrangement diverts the second reactant gas source 236 away from the primary flow line 240 within the valve system 230. The second gas source diverter flow line 268 diverts gas from the second reactant gas source 236 such that the gas does not enter the processing chamber 200. In one example, second gas source diverter flow line 268 diverts the gas towards one or more of a scrubber, a flare, a storage tank, equipment that recycles or reuses the gas, and/or back towards the second reactant gas source 236. The one or more diverter valves 262 and 266 facilitate quickly altering the gases and/or the amount of gases provided to a processing chamber. The one or more diverter valves 262 and 266 also facilitate reducing or eliminating an alteration of flow rates of gases flowing through the valve system 230.

Figure 3:
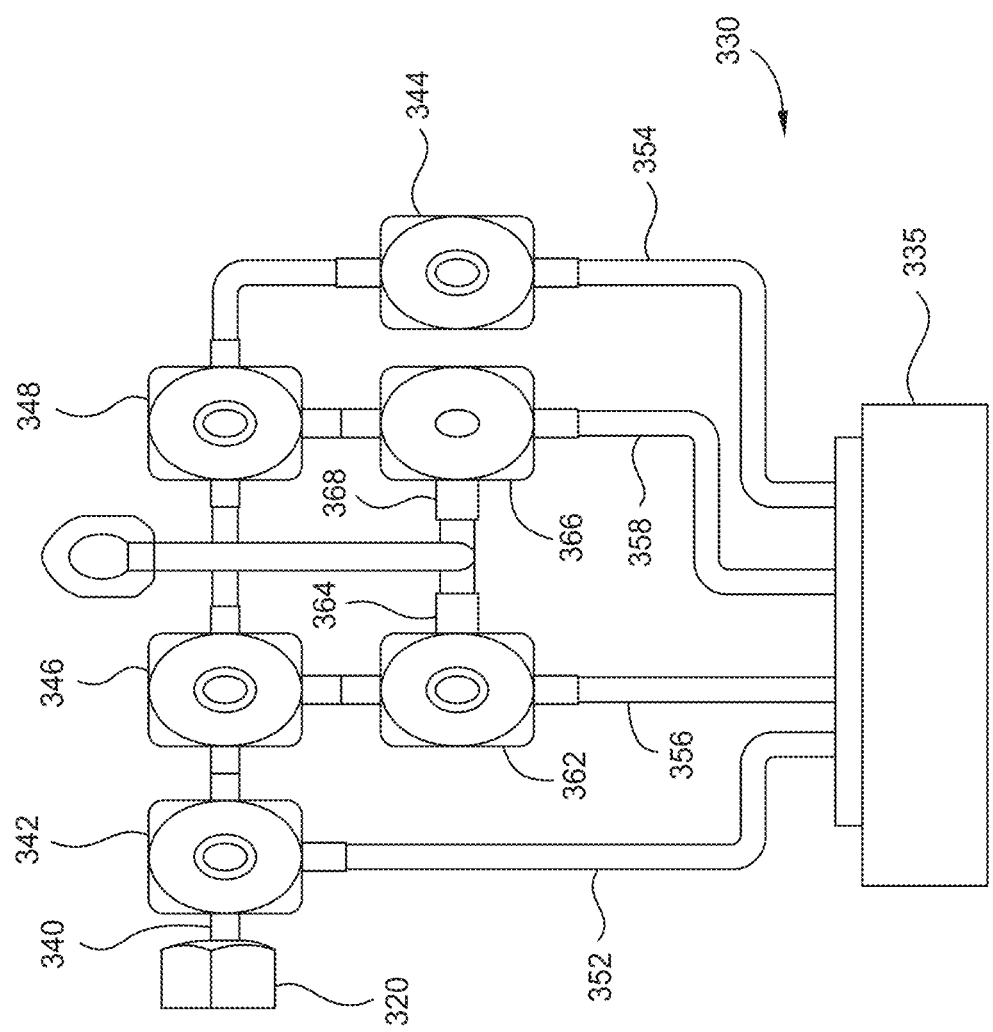
FIG. 3 is a perspective view of valve system, in accordance with one implementation of the present disclosure.

Referring now to FIG. 3, a perspective view of a valve system 330 in accordance with one implementation of the present disclosure. The valve system 330 may be similar to, or used as, the valve system 230 shown above in FIG. 2 and includes a primary flow line 340 that is coupled to a processing chamber to selectively provide one or more gas sources to the processing chamber. Gas provided to the primary flow line 340 may be introduced into a processing chamber, such as through an inlet port 320 fluidly coupled to the processing chamber.

FIG. 3 shows a gas manifold 335 that includes or is used to provide the gas sources through the primary flow line 340 within the valve system 330. For example, the valve system 330 is shown as providing one or more reactant gas sources or carrier gas sources out of gas manifold 335 to the processing chamber 300. The valve system 330 includes one or more gas source flow lines 352, 354, 356, and 358 that are fluidly coupled to the primary flow line 340 to provide the gas sources from the gas manifold 335 to the primary flow line 340.

A first gas source flow line 352 that is fluidly coupled to primary flow line 340 through a first gas source valve 342, and a second gas source flow line 354 that is fluidly coupled to primary flow line 340 through a second gas source valve 344. The first gas source valve 342 and the second gas source valve 344 are positioned to be in series along the primary flow line 340. A third gas source flow line 356 and a fourth gas source flow line 358 are included within the valve system 330 and fluidly coupled to the primary flow line through a third gas source valve 346 and a fourth gas source valve 348, respectively. As with the aspects discussed above, the gas source valves 342, 344, 346, and 348 are positioned in series along the primary flow line 340.

A first gas source diverter valve 362 is positioned along the third gas source flow line 356, and a second gas source diverter valve 366 is positioned along the fourth gas source flow line 358. As with the aspects discussed above, the first and second gas source diverter valves 362 and 366 may be used to divert gas away from the third and fourth gas source flow lines 356 and 358, respectively, and out of the valve system 330.

The valve system 330 depicted in FIG. 3 is a perspective view, in which valves 342, 344, 346, 348, 362, and 366 of the valve system 330 are fluidly coupled to each other through one or more conduits. For example, the conduits used to house one or more of the flow lines 352, 354, 356, and 358 may include tubes, such as stainless steel tubes, that are welded to each other and to the valves 342, 344, 346, 348, 362, and 366. Further, one or more seals, such as O-ring seals, may be incorporated within the valve system 330, such as between one or more of the valves 342, 344, 346, 348, 362, and 366 and the flow lines 352, 354, 356, and 358 to facilitate fluidic coupling.

Figure 4:
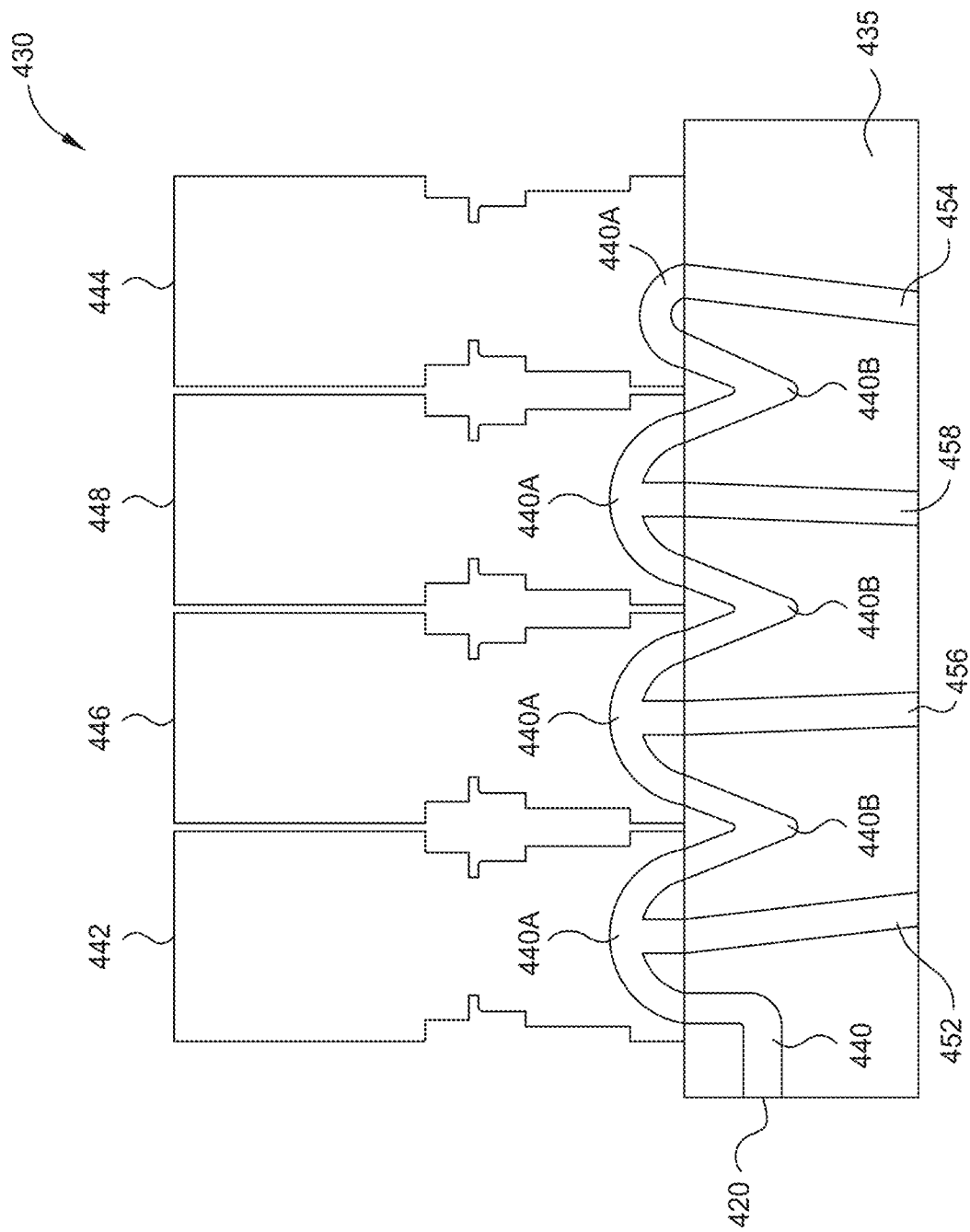
FIG. 4 is a perspective view of a valve system, in accordance with one implementation of the present disclosure.

FIG. 4 is a perspective view of a valve system 430 in accordance with one implementation of the present disclosure. FIG. 4 shows a primary flow line 440 that is partially embedded within a gas manifold 435, in which the primary flow line 440 selectively provides one or more gas sources to a processing chamber via an inlet port 420. The valve system 430 includes multiple gas source flow lines 452, 454, 456, and 458 that are fluidly coupled to the primary flow line 440 to provide gas from the gas sources from the gas manifold 435 to the primary flow line 440.

As with the aspects described above, the valve system 430 includes a first gas source flow line 452 and a second gas source flow line 454. The first gas source flow line 452 is fluidly coupled to primary flow line 440 through a first gas source valve 442. The second gas source flow line 454 that is fluidly coupled to primary flow line 440 through a second gas source valve 444. The first gas source flow line 452 and the second gas source flow line 454 are positioned within the primary flow line 440 through the first gas source valve 442 and the second gas source valve 444. Further, the first gas source valve 442 and the second gas source valve 444 are positioned to be in series along the primary flow line 440.

A third gas source flow line 456 and a fourth gas source flow line 458 are also included within the valve system 430. As discussed above, the gas source flow lines 452, 454, 456, and 458 are fluidly coupled to the primary flow line 440 through the gas source valves 442, 444, 446, and 448, respectively. As such, and as with the aspects described above, the gas source valves 442, 444, 446, and 448 are positioned in series along the primary flow line 440. Further, in the event that the second gas source flow line 454 and the second gas source valve 444 are used to provide a carrier gas to the processing chamber, the second gas source valve 444 is positioned upstream with respect to the gas source valves 442, 446, and 448.

As also shown in FIG. 4, the primary flow line 440 may be formed at least partially through the gas source valves 442, 444, 446, and 448 and at least partially through the gas manifold 435. For example, the primary flow line 440 may be formed into first primary flow line portions 440A and second primary flow line portions 440B. The first primary flow line portions 440A are formed within and extend through the gas source valves 442, 444, 446, and 448. The second primary flow line portions 440B are formed within and extend through the gas manifold 435. Thus, gas flowing through the primary flow line 440 flows between portions 440A and 440B to provide gas from the gas source flow lines 452, 454, 456, and 458 and to the processing chamber. Furthermore, the gas source flow lines 452, 454, 456, and 458 are shown formed within and extending through the gas manifold 435 to provide gas to the gas source valves 442, 444, 446, 448, respectively.

Figure 5:
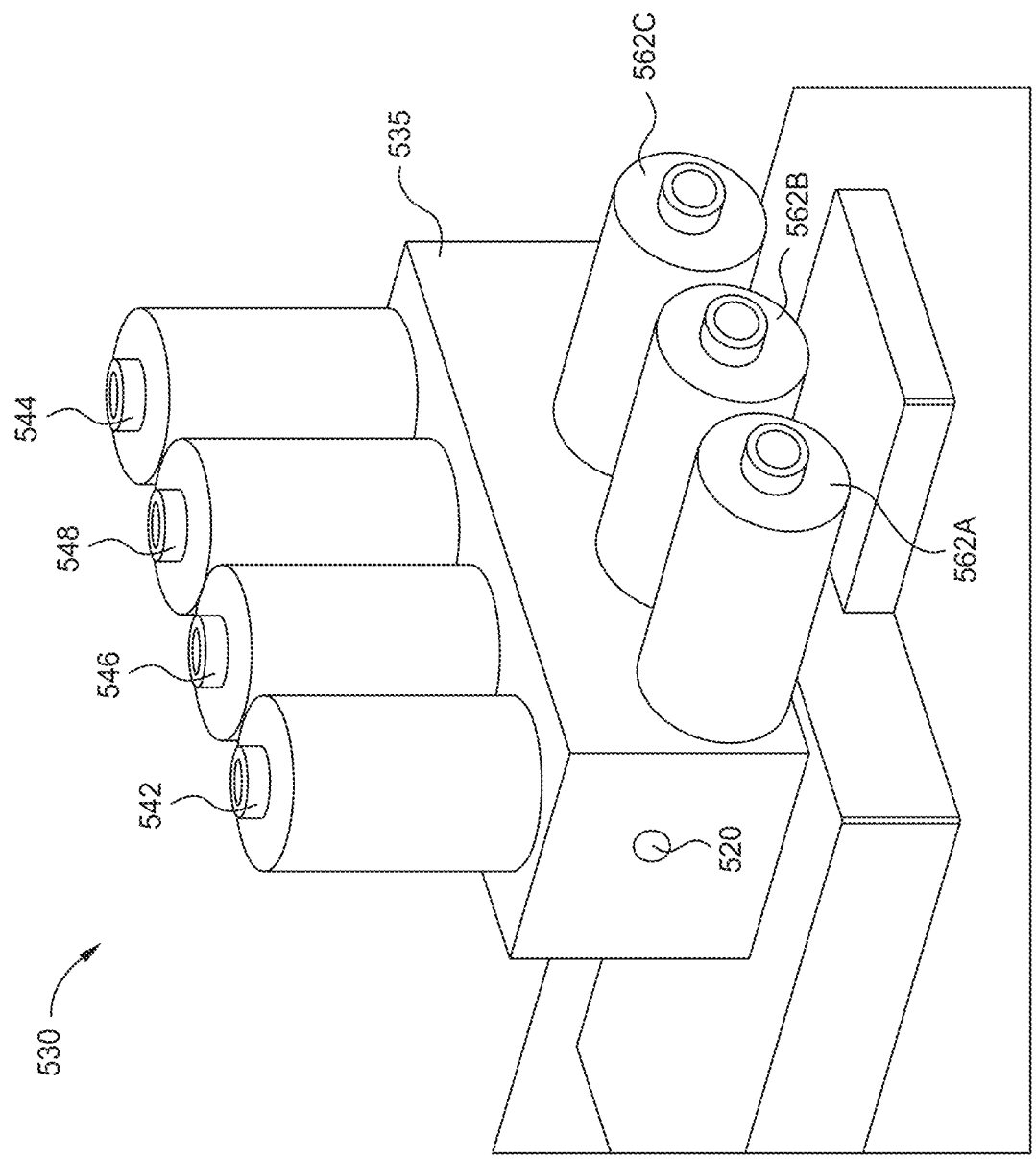
FIG. 5 is a perspective view of valve system, in accordance with one implementation of the present disclosure.

FIG. 5 is a perspective view of a valve system 530 in accordance with one implementation of the present disclosure. FIG. 5 shows a gas manifold 535 with the gas source valves 542, 544, 546, and 548 attached and fluidly coupled to the gas manifold 535. As with the aspects described above, a primary flow line is included within the gas manifold 535 to selectively provide one or more gas sources to the processing chamber via an inlet port 520. Gas source diverter valves 562A, 562B, and 562C are also included in the valve system 530, such as by being attached and fluidly coupled to the gas manifold 535. Diverter valve flow paths coupled to the gas source diverter valves 562A, 562B, and 562B provide the gas from the gas sources out from the gas manifold 535 and divert away from the primary flow line.

Figure 6:
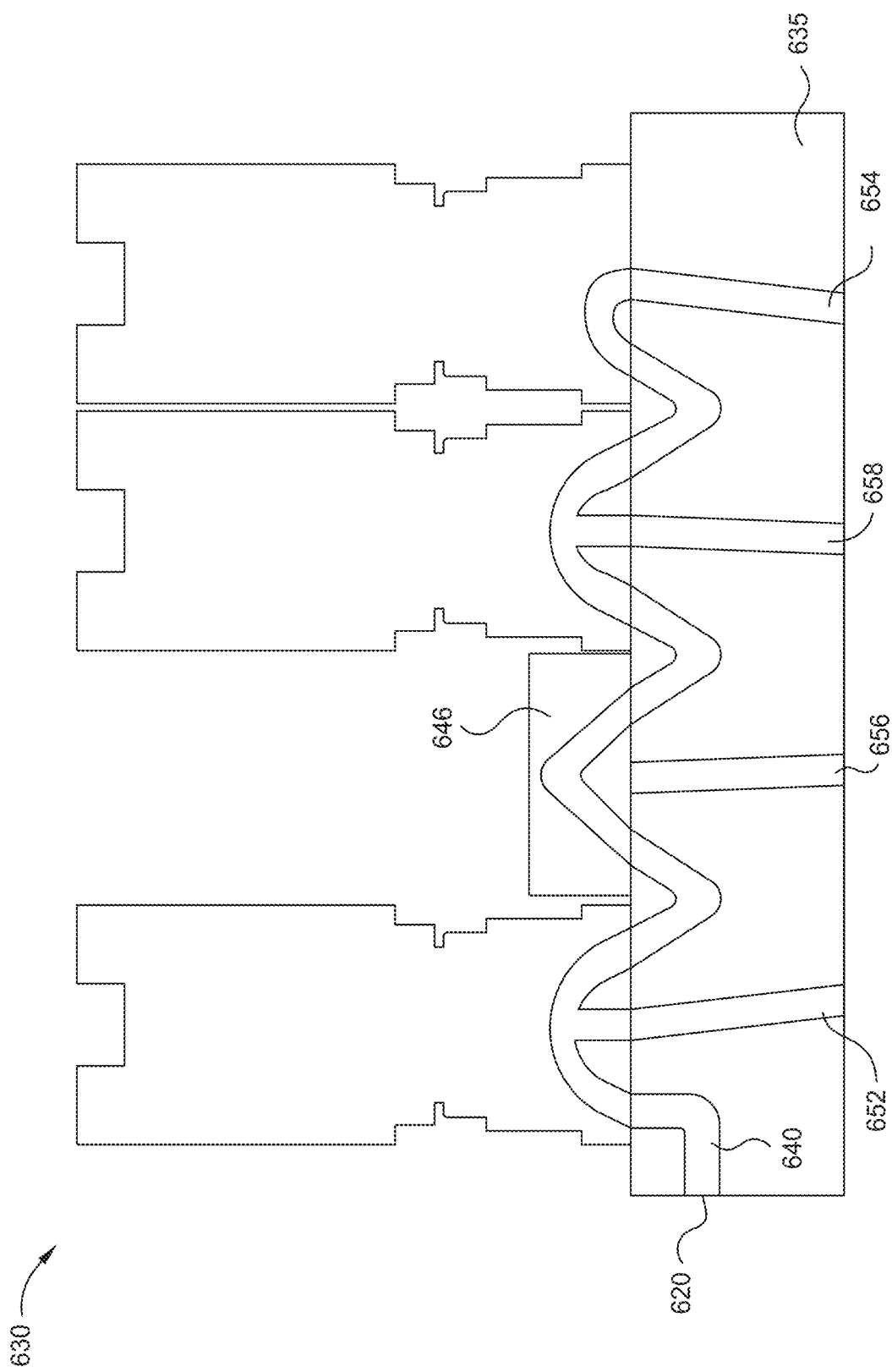
FIG. 6 is a perspective view of valve system, in accordance with one implementation of the present disclosure.

FIG. 6 is a perspective view of valve system 630 in accordance with one implementation of the present disclosure. FIG. 6 shows a primary flow line 640 that is partially embedded within a gas manifold 635, in which the primary flow line 640 selectively provides one or more gas sources to a processing chamber via an inlet port 620. The valve system 630 includes multiple gas source flow lines 652, 654, 656, and 658 that are fluidly coupled to the primary flow line 640 to provide gas sources from the gas manifold 635 to the primary flow line 640.

The valve system 630 includes two or more gas source valves (three are shown). In the example illustrated in FIG. 6, the third gas source valve is removed and replaced with an adapter plate 646. In such an example, the third gas source flow line 656 is not fluidly coupled to the primary flow line 640. The adapter plate 646 fluidly decouples the third gas source flow line 656 from the primary flow line 640 and/or blocks a gas from flowing from the third gas source flow line 656 and into the primary flow line 640. However, the adapter plate 646 may be used to have the primary flow line 640 formed within and extending through the adapter plate 646. Further, one having ordinary skill in the art and having the benefit of the present disclosure would be able to appreciate that one or more adapter plates 646 could be positioned in place at any gas source valve position. The aspects of the valve system 630 illustrated in FIG. 6 facilitate quickly replacing and/or maintaining components of the valve system 630, such as the gas source valves. The aspects of the valve system 630, such as the adapter plate 646, also facilitate quickly altering the gases and/or the amount of gases provided to a processing chamber.

Figure 8:
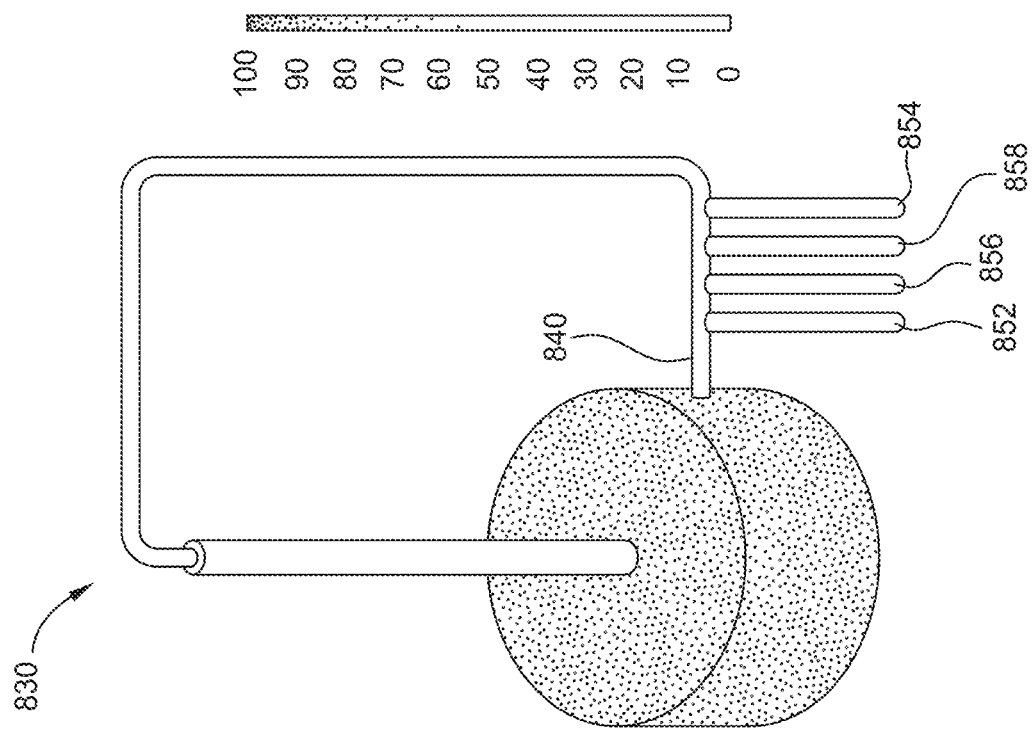
FIG. 8 is a flow model of a processing chamber coupled with a valve system, in accordance with one implementation of the present disclosure.
Figure 7:
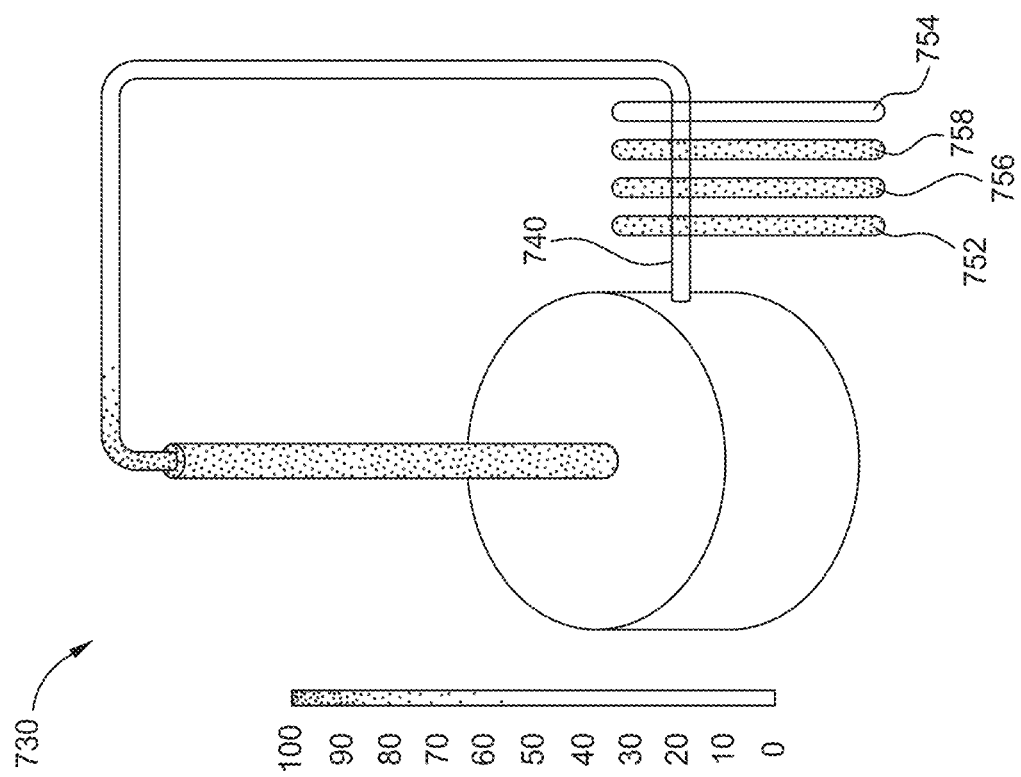
FIG. 7 is a flow model of a processing chamber coupled with a valve system, in accordance with one implementation of the present disclosure.

FIGS. 7 and 8 provide flow models of residual gas remaining within a valve system and a processing chamber. In particular, FIG. 7 is a flow model of a valve system 730 with gas source flow lines 752, 754, 756, and 758 fluidly coupled to a primary flow line 740 through gas source valves. In example illustrated, the gas source valves and the respective gas source flow lines 752, 754, 756, and 758 are positioned in parallel along primary flow line 740. The flow model shows residual gas within the valve system 730 after a purge period of about ten seconds followed by a pump period of about ten seconds. As shown, despite the purge and pump periods, a substantial amount of residual gas accumulates within the gas source flow lines 752, 756, and 758, which may lead to particle formation or dusting within the gas delivery path due to the mixing of incompatible gases. Residual gas also accumulates in a portion of the primary flow line 740. This particle formation may lead to non-uniform substrates and contamination of the substrates, thereby decreasing quality.

Further, FIG. 8 is a flow model of a valve system 830 with gas source flow lines 852, 854, 856, and 858 fluidly coupled to a primary flow line 840 through gas source valves. In the example illustrated in FIG. 8, the gas source valves and the respective gas source flow lines 852, 854, 856, and 858 are positioned in series along primary flow line 840. The flow model shows less residual gas within the valve system 830, even after a purge period of only three seconds without any pump period. As shown between FIGS. 7 and 8, having the gas source valves coupled in series to the primary flow line leads to less residual gas buildup within the gas flow lines and the valve system. This reduces the opportunity of particle formation or dusting within the gas delivery path due to the decreased mixing of incompatible gases. Further, this may increase the time efficiency of the processing chamber by reducing or decreasing the number of and/or length of purge and pump periods needed to remove residual gases.

Benefits of the present disclosure include a significant decrease in residual gas buildup within a gas delivery path. The decrease in residual gas buildup may decrease particulate formation within the gas delivery path, and thus improve the quality of substrate production. Additionally, aspects of the present disclosure may reduce purge and pump times between gas cycles, thus decreasing the transition time between film deposition operations when processing substrates. The present disclosure may, therefore, lend to a more efficient and cost effective substrate processing system with an increased substrate quality yield.

While the foregoing is directed to aspects of the present disclosure, other and further aspects of the disclosure may be devised without departing from the basic scope thereof, and the scope thereof is determined by the claims that follow.

What is claimed is:
1. A valve system to control flow of gas, the valve system comprising;
   a gas manifold;
   a primary flow line partially formed in the gas manifold and partially formed in a plurality of gas source valves removably attached to the gas manifold;
   a first gas source flow line formed in the gas manifold and fluidly coupled to the primary flow line through a first gas source valve of the plurality of gas source valves;
   a second gas source flow line formed in the gas manifold and fluidly coupled to the primary flow line through a second gas source valve of the plurality of gas source valves, the first gas source valve and the second gas source valve being positioned in series along the primary flow line; and a third gas source flow line formed in the gas manifold and fluidly blocked from the primary flow line by an adapter plate removably attached to the gas manifold.

2. The valve system of claim 1, wherein the first gas source valve and the second gas source valve are configured to be in a normally open position with respect to the primary flow line.

3. The valve system of claim 1, wherein the primary flow line comprises:
  a three-way passage formed in the first gas source valve;
  a first two-way passage formed in the second gas source valve; and
  a second two-way passage formed in the adapter plate.

4. The valve system of claim 3, wherein the second gas source valve is positioned upstream within the primary flow line with respect to the first gas source valve.

5. The valve system of claim 1, wherein a first gas source is configured to be fluidly coupled with the first gas source flow line and a second gas source is configured to be fluidly coupled with the second gas source flow line.

6. The valve system of claim 5, wherein the first gas source comprises a reactant gas, and the reactant gas comprises one or more of oxygen ($O_2$), tetraethyl orthosilicate (TEOS) ($Si(OC_2H_5)_4$), or silane ($SiH_4$).

7. The valve system of claim 6, wherein the second gas source comprises a carrier gas provided to the second gas source flow line, and the carrier gas comprises one or more of argon (Ar), helium (He), or nitrogen ($N_2$).

8. The valve system of claim 7, wherein the first gas source flow line is fluidly coupled to a first gas source diverter flow line fluidly coupled to the first gas source flow line through a first gas diverter valve, and wherein the first gas diverter valve comprises a two-way valve that is configured to be in a normally closed position with respect to the first gas source diverter flow line.

9. The valve system of claim 8, wherein the first gas source valve is configured to move between a source open position and a source closed position, wherein, in the source open position, the reactant gas is configured to flow to the primary flow line, and in the source closed position, the reactant gas is configured to flow to the first gas source diverter flow line.

10. The valve system of claim 9, wherein the second gas source valve is configured to move between a source open position and a source closed position, wherein, in the source open position, the carrier gas is configured to flow to the primary flow line, and in the source closed position, the carrier gas is prevented from flowing to the primary flow line.

11. The valve system of claim 1, wherein, when the first gas source valve is in a source open position, the second gas source valve is in a source open position.

12. The valve system of claim 1, wherein the primary flow line is fluidly coupled to an inlet port of a processing chamber, and the processing chamber further comprises an outlet port with a vacuum pump fluidly coupled to the outlet port and configured to pump gas out of the processing chamber.

13. A substrate processing system, comprising:
  a processing chamber comprising a substrate support positioned therein; and
  a valve system fluidly coupled to the processing chamber and configured to control flow of gas into the processing chamber, the valve system comprising;
    a primary flow line;
    an oxygen ($O_2$) flow line fluidly coupled to the primary flow line through an oxygen source valve;
    a tetraethyl orthosilicate (TEOS) ($Si(OC_2H_5)_4$) flow line fluidly coupled to the primary flow line through a TEOS source valve;
    a silane ($SiH_4$) flow line fluidly coupled to the primary flow line through a silane source valve; and
    a carrier gas flow line fluidly coupled to the primary flow line through a carrier gas source valve;
    wherein the oxygen source valve, the TEOS source valve, the silane source valve, and the carrier gas source valve are positioned in series along the primary flow line; and
    wherein the carrier gas source valve is positioned upstream within the primary flow line with respect to the oxygen source valve, the TEOS source valve, and the silane source valve; and
  a controller comprising software that, when executed, causes:
    maintaining the carrier gas source valve in a source open position while maintaining one or more of the oxygen source valve, the TEOS source valve, or the silane source valve in a source open position.

14. The substrate processing system of claim 13, wherein the oxygen source valve, the TEOS source valve, and the silane source valve are configured to be in a normally open position with respect to the primary flow line.

15. The substrate processing system of claim 13, wherein a carrier gas source is configured to be fluidly coupled with the carrier gas flow line, and the carrier gas source comprises a carrier gas and the carrier gas comprises one or more of argon (Ar), helium (He), or nitrogen ($N_2$).

16. The substrate processing system of claim 13, wherein the valve system further comprises a gas manifold, and the primary flow line is formed at least partially in the oxygen source valve, at least partially in the TEOS source valve, at least partially in the silane source valve, at least partially in the carrier gas source valve, and at least partially in the gas manifold.

17. A method of distributing gas into a processing chamber, comprising:
  positioning a substrate upon a substrate support within a processing chamber;
  providing a first gas to the processing chamber through a first gas source valve that fluidly couples a first gas source flow line to a primary flow line;
  providing a second gas to the processing chamber through a second gas source valve that fluidly couples a second gas source flow line to the primary flow line, the first gas source valve and the second gas source valve being positioned in series along the primary flow line;
  replacing the first gas source valve with an adapter plate that fluidly decouples the first gas source flow line from the primary flow line; and
  providing a third gas to the processing chamber through a third gas source valve that fluidly couples a third gas source flow line to the primary flow line.

18. The method of claim 17, wherein each of the first gas and the third gas comprises one or more of oxygen ($O_2$), tetraethyl orthosilicate (TEOS) ($Si(OC_2H_5)_4$), or silane ($SiH_4$), and the second gas comprises one or more of argon (Ar), helium (He), or nitrogen ($N_2$).

19. The method of claim 17, wherein the second gas is provided to the processing chamber while providing the first gas to the processing chamber and while providing the third gas to the processing chamber.

* * * * *